United States Patent
Chang et al.

(10) Patent No.: US 10,523,239 B2
(45) Date of Patent: Dec. 31, 2019

(54) METHOD FOR GENERATING ENCODED DATA THAT IS ENCODED BASED ON LOW-DENSITY PARITY-CHECK CODES, AND METHOD FOR DECODING THE ENCODED DATA

(71) Applicant: National Chiao Tung University, Hsinchu (TW)

(72) Inventors: Hsie-Chia Chang, Hsinchu (TW); Shu Lin, Milpitas, CA (US); Yen-Chin Liao, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 25 days.

(21) Appl. No.: 15/985,217

(22) Filed: May 21, 2018

(65) Prior Publication Data

US 2019/0319640 A1    Oct. 17, 2019

Related U.S. Application Data

(63) Continuation-in-part of application No. 15/951,587, filed on Apr. 12, 2018, now abandoned.

(51) Int. Cl.
*H03M 13/11*    (2006.01)

(52) U.S. Cl.
CPC .... *H03M 13/1174* (2013.01); *H03M 13/1157* (2013.01); *H03M 13/1168* (2013.01)

(58) Field of Classification Search
CPC ......... H03M 13/1148; H03M 13/6362; H03M 13/1191

See application file for complete search history.

(56) References Cited

U.S. PATENT DOCUMENTS

| | | | |
|---|---|---|---|
| 9,021,336 B1 | 4/2015 | Northcott | |
| 9,495,243 B2 | 11/2016 | Lu et al. | |
| 2014/0157079 A1* | 6/2014 | Park | H03M 13/116 714/758 |
| 2014/0181612 A1* | 6/2014 | Gunnam | H03M 13/1177 714/752 |
| 2014/0380114 A1* | 12/2014 | Alexeev | H03M 13/2906 714/755 |
| 2015/0155889 A1* | 6/2015 | Shen | H03M 13/033 714/776 |
| 2015/0363265 A1* | 12/2015 | Liu | G06F 11/1068 714/764 |
| 2017/0294923 A1* | 10/2017 | Bhatia | H03M 13/1108 |
| 2017/0359087 A1* | 12/2017 | Muhammad | H04L 1/0041 |

OTHER PUBLICATIONS

T. V. Nguyen, etc, "The Design of Rate-Compatible Protograph LDPC Codes," IEEE Trans. Comm, vol. 60, No. 10, Oct. 2012.

* cited by examiner

*Primary Examiner* — Thien Nguyen
(74) *Attorney, Agent, or Firm* — Fish & Richardson P.C.

(57) ABSTRACT

A method for generating encoded data includes: generating at least one local LDPC matrix and a global LDPC matrix, the global LDPC matrix relating to each of the at least one local LDPC matrix; repeatedly selecting one of the at least one local LDPC matrix as a target local LDPC matrix until a number t of the target local LDPC matrices are selected, where t is a user-defined number that is greater than one; generating a block matrix that includes the target local LDPC matrices; generating a primary LDPC matrix that includes a first primary matrix part relating to the block matrix, and a second primary matrix part relating to the global LDPC matrix; and encoding data based on the primary LDPC matrix.

11 Claims, 10 Drawing Sheets

METHOD FOR GENERATING ENCODED DATA THAT IS ENCODED BASED ON LOW-DENSITY PARITY-CHECK CODES, AND METHOD FOR DECODING THE ENCODED DATA

CROSS-REFERENCE TO RELATED APPLICATION

This application is a continuation-in-part of U.S. application Ser. No. 15/951,587, filed Apr. 12, 2018, the contents of which are incorporated herein by reference in its entirety.

FIELD

The disclosure relates to encoding and decoding, and more particularly to a method for generating encoded data that is encoded based on low-density parity-check (LDPC) codes, and a method for decoding the encoded data.

BACKGROUND

In wireless communication, low-density parity-check (LDPC) codes, which are constructed using sparse matrices, are often used to correct erroneous linear block codes of which errors may occur during transmission. Under the circumstances that certain design specifications are conformed with, block codes that have longer codeword lengths usually have better error correction ability.

However, a longer codeword length leads to more redundancies, resulting in high costs in terms of software and hardware equipments for computation during encoding and decoding. In addition, in an application of, for instance, mobile wireless communication, different code rates that may be present in a transmission channel which is used for data transmission may limit a block size of to-be-transmitted data, thereby restricting the selectable codeword length for the block codes.

SUMMARY

Therefore, an object of the disclosure is to provide a method for generating encoded data that may have advantages of having relatively short codeword lengths for lower computation cost while maintaining error correction ability comparable to the case with longer codeword lengths.

According to the disclosure, the method for generating encoded data that is encoded based on low-density parity-check (LDPC) codes by an encoder device for data transmission is proposed. The method includes: generating at least one local LDPC matrix and a global LDPC matrix, the global LDPC matrix relating to each of the at least one local LDPC matrix; repeatedly selecting one of the at least one local LDPC matrix as a target local LDPC matrix until a number t of the target local LDPC matrices are selected, where t is a user-defined number that is greater than one; generating a block matrix that includes the target local LDPC matrices; generating a primary LDPC matrix that includes a first primary matrix part relating to the block matrix, and a second primary matrix part relating to the global LDPC matrix; and encoding data based on the primary LDPC matrix so as to generate the encoded data.

Another object of this disclosure is to provide a method for decoding channel data which is received from a transmission channel and which is encoded using a primary LDPC matrix.

According to the disclosure, the primary LDPC matrix includes a first primary matrix part relating to a plurality of local LDPC matrices, and a second primary matrix part relating to a global LDPC matrix. The global LDPC matrix relates to each of the local LDPC matrices. The method is implemented by a decoder device and includes: performing decoding on the channel data based on the first primary matrix part to generate a local decoding result; determining, based on the local decoding result, whether the channel data can be completely decoded based on the first primary matrix part; and upon determining that the channel data cannot be completely decoded based on the first primary matrix part, performing decoding on the channel data based on the second primary matrix part.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
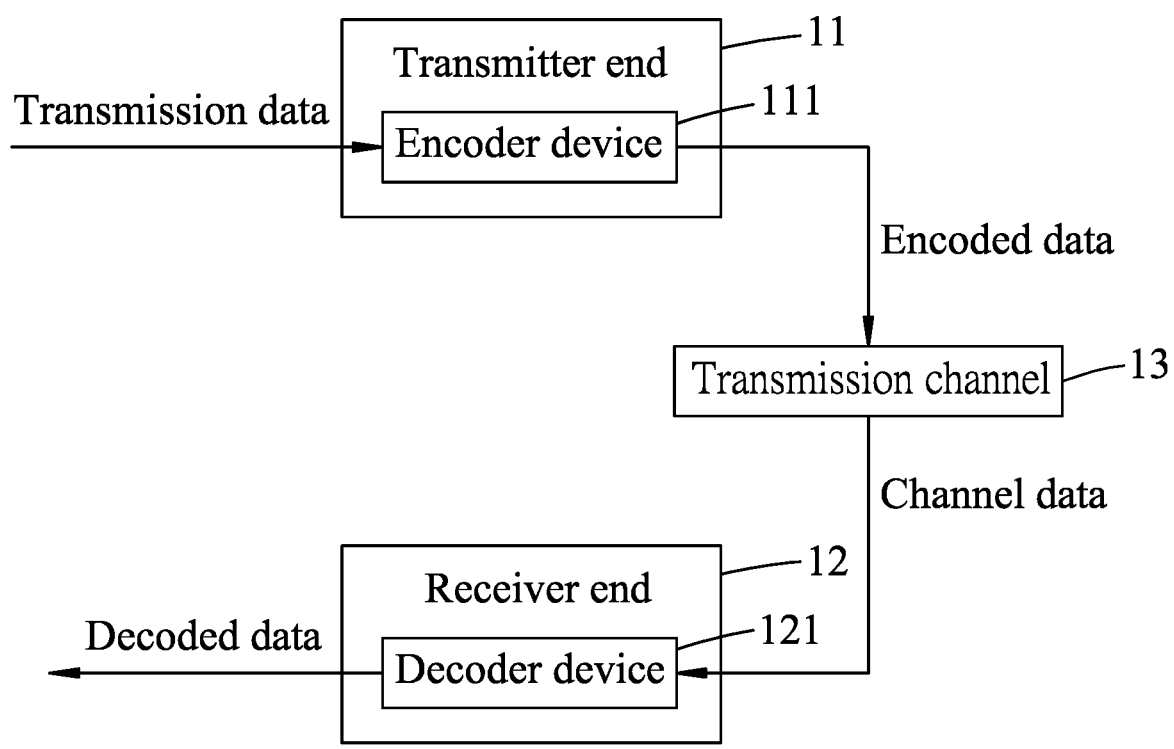
FIG. 1 is block diagram illustrating a transmitter end and a receiver end that implement embodiments of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

FIG. 1 shows a transmitter end 11 implementing embodiments of a method for generating encoded data that is encoded based on low-density parity-check (LDPC) codes, and a receiver end 12 for decoding the encoded data according to this disclosure.

The transmitter end 11 includes an encoder device 111 configured to perform encoding on transmission data based on LDPC codes to generate encoded data, and to transmit the encoded data to the receiver end 12 via a transmission channel 13.

The receiver end 12 includes a decoder device 121 configured to perform decoding on the encoded data received via the transmission channel 13 based on LDPC codes, thereby acquiring decoded data that corresponds to the transmission data. Since interference may be present in the transmission channel 13 during transmission of the encoded data, the encoded data received by the receiver end 12 may not be identical to the encoded data transmitted by the transmitter end 11, and the decoded data may not be identical to the transmission data. Accordingly, the encoded data received by the receiver end 12 via the transmission channel 13 will be called "channel data" hereinafter.

Figure 2:
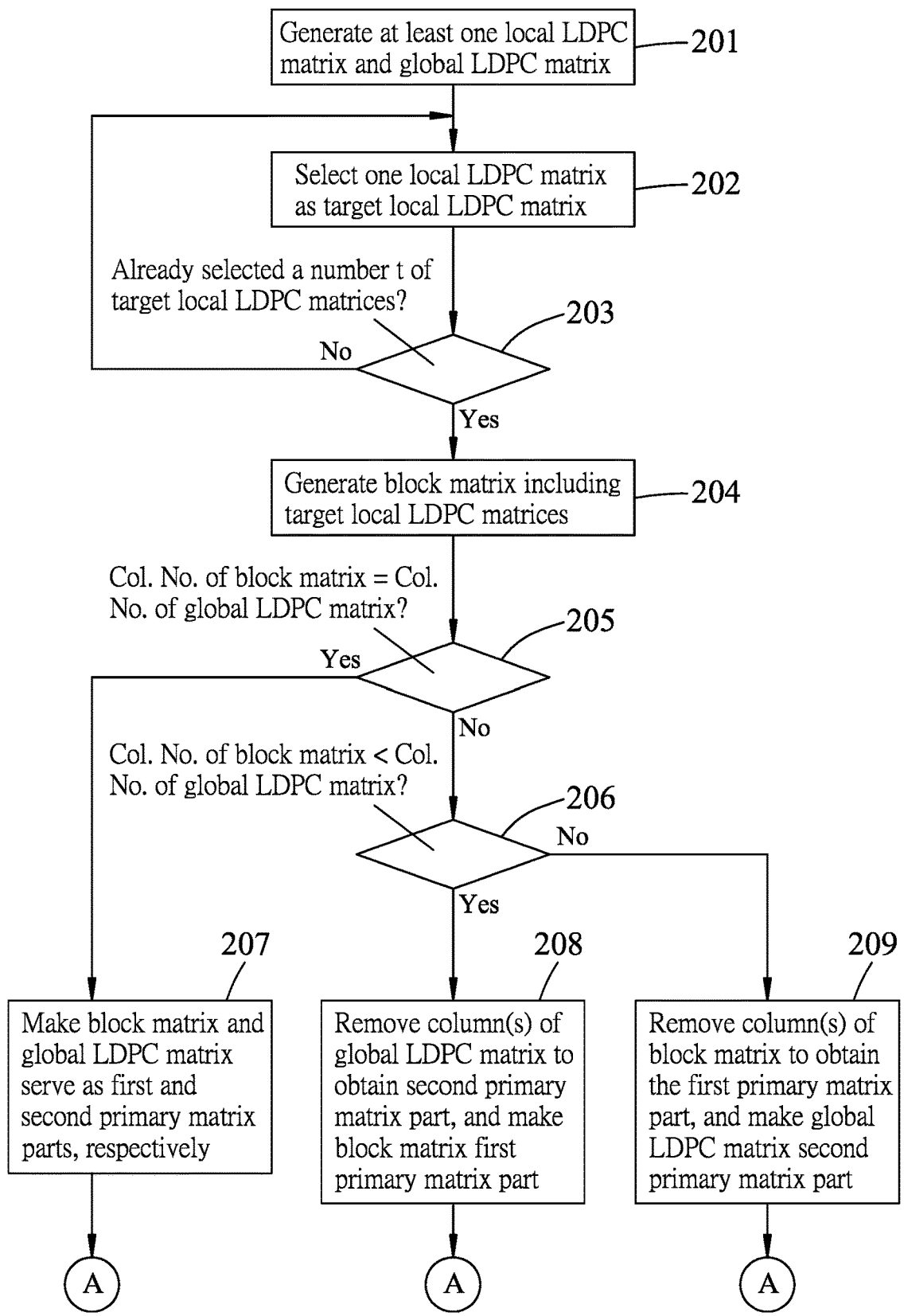
FIGS. 2 and 3 cooperatively show a flow chart illustrating steps of a first embodiment of a method for generating encoded data according to this disclosure.
Figure 3:
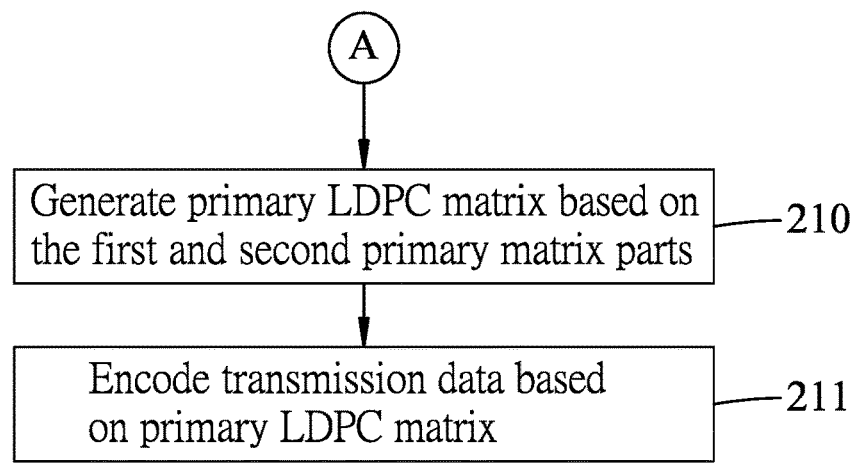

FIGS. 2 and 3 exemplarily illustrate how the encoder device 111 implements a first embodiment of the method for generating encoded data based on a primary LDPC matrix ($H_P$) that includes a first primary matrix part and a second primary matrix part according to this disclosure.

In step 201, the encoder device 111 generates a number n of local LDPC matrices ($H_{Li}$) and a global LDPC matrix ($H_G$), where n is a positive integer greater than or equal to one, and i is an arbitrary integer from 1 to n (1 and n included). The global LDPC matrix relates to each of the local LDPC matrix/matrices. It is noted that the embodiments of this disclosure exemplarily use more than one local LDPC matrix ($H_{Li}$, i.e., n>1), but this disclosure is not limited thereto.

In the first embodiment, each of the local LDPC matrices ($H_{Li}$) and the global LDPC matrix ($H_G$) is constructed using elements of a finite field of order q, where q is a prime power. The $i^{th}$ one of the local LDPC matrices ($H_{Li}$) is represented as:

$$H_{Li}(d_{1i}, \gamma_i) = \begin{bmatrix} \gamma_i^0 & \gamma_i^1 & \cdots & \gamma_i^{(\lambda-1)} \\ \gamma_i^0 & \gamma_i^2 & \cdots & \gamma_i^{2(\lambda-1)} \\ \vdots & \vdots & \ddots & \vdots \\ \gamma_i^0 & \gamma_i^{d_{1i}} & \cdots & \gamma_i^{d_{1i}(\lambda-1)} \end{bmatrix},$$

where $\gamma_i = \beta^{p_i}$, $\beta = \alpha^{q-1/p_1 p_2 \cdots p_n \lambda}$, $\alpha$ belongs to the finite field of order q, $p_i$ and $\lambda$ are prime divisors of q−1, $\lambda > \max(p_i)$, and $$d_{1i} < \left\lfloor \frac{\lambda}{p_i} \right\rfloor$$

(note: $\lfloor . \rfloor$ is a floor function).

The global LDPC matrix ($H_G$) relates to the second primary matrix part of the primary LDPC matrix ($H_P$), and is represented as:

$$H_G(d_2, \beta) = \begin{bmatrix} \beta^0 & \beta^1 & \cdots & \beta^{(p_1 p_2 \cdots p_n \lambda - 1)} \\ \beta^0 & \beta^2 & \cdots & \beta^{2(p_1 p_2 \cdots p_n \lambda - 1)} \\ \vdots & \vdots & \ddots & \vdots \\ \beta^0 & \beta^{d_2} & \cdots & \beta^{d_2(p_1 p_2 \cdots p_n \lambda - 1)} \end{bmatrix},$$

where $d_2 < \min(p_i)$.

For instance, in a case that $q=5^6$, $n=2$, $p_1=3$, $p_2=2$, and $\lambda=31$, $q-1=2^3 \times 3^2 \times 7 \times 31 = (2 \times 3 \times 31) \times 84$, $\beta = \alpha^{84}$, $\gamma_i = \beta^3$, $\gamma_2 = \beta^2$, $$H_{L1}(d_{11}, \gamma_1) = \begin{bmatrix} \beta^0 & \beta^3 & \cdots & \beta^{3*30} \\ \beta^0 & \beta^{2*3} & \cdots & \beta^{2*3*30} \\ \vdots & \vdots & \ddots & \vdots \\ \beta^0 & \beta^{d_{11}*3} & \cdots & \beta^{d_{11}*3*30} \end{bmatrix},$$

$$H_{L2}(d_{12}, \gamma_2) = \begin{bmatrix} \beta^0 & \beta^2 & \cdots & \beta^{2*30} \\ \beta^0 & \beta^{2*2} & \cdots & \beta^{2*2*30} \\ \vdots & \vdots & \ddots & \vdots \\ \beta^0 & \beta^{d_{12}*2} & \cdots & \beta^{d_{12}*2*30} \end{bmatrix}, \text{ and}$$

$$H_G(d_2, \beta) = \begin{bmatrix} \beta^0 & \beta^1 & \cdots & \beta^{185} \\ \beta^0 & \beta^2 & \cdots & \beta^{2*185} \\ \vdots & \vdots & \ddots & \vdots \\ \beta^0 & \beta^{d_2} & \cdots & \beta^{d_2*185} \end{bmatrix},$$

where $d_{11} < 10$, $d_{12} < 15$ and $d_2 < 2$.

In step 202, the encoder device 111 selects one of the local LDPC matrices ($H_{Li}$) as a target local LDPC matrix ($H_L$).

In step 203, the encoder device 111 determines whether a number t of the target local LDPC matrices ($H_L$) has been selected. The flow goes to step S204 when the determination is affirmative, and goes back to step 202 (i.e., repeating step 202 to select another target local LDPC matrix ($H_L$)) when otherwise. It is noted that t is a user-determined number greater than one. It is noted that the target local LDPC matrices ($H_L$) selected during the repetition of step 202 may either be the same as or different from existing target local LDPC matrix or matrices ($H_L$).

In step 204, the encoder device 111 generates a block matrix ($H_{B1}$) that includes the target local LDPC matrices ($H_L^{(1)}$ to $H_L^{(t)}$) selected in different instances of step 202, and that relates to the first primary matrix part of the primary LDPC matrix ($H_P$), where $H_L^{(1)}$ represents the first selected target local LDPC matrix and $H_L^{(t)}$ represents the $t^{th}$ selected target local LDPC matrix. In this embodiment, the target local LDPC matrices ($H_L^{(1)}$ to $H_L^{(t)}$) are arranged along a main diagonal of the block matrix ($H_{B1}$), and the block matrix ($H_{B1}$) can be represented as:

$$H_{B1} = \begin{bmatrix} H_L^{(1)} & & & \\ & H_L^{(2)} & & \\ & & \ddots & \\ & & & H_L^{(t)} \end{bmatrix}$$

where all the elements other than the elements of the target local LDPC matrices ($H_L^{(1)}$ to $H_L^{(t)}$) in the block matrix ($H_{B1}$) are zero.

In one embodiment, the block matrix ($H_{B1}$) can be exemplified as:

$$H_{B1} = \begin{bmatrix} H_L^{(1)} & & H_L^{(1)} & & H_L^{(1)} & \\ & H_L^{(2)} & & H_L^{(2)} & \cdots & H_L^{(2)} \\ & & \ddots & & \ddots & & \ddots \\ & & & H_L^{(t)} & & H_L^{(t)} & & H_L^{(t)} \end{bmatrix}$$

where all the elements other than the elements of the target local LDPC matrices ($H_L^{(1)}$ to $H_L^{(t)}$) in the block matrix ($H_{B1}$) are zero.

In one embodiment, the encoder device 111 may further perform adjustment on the block matrix ($H_{B1}$). For instance, the encoder device 111 may adjust arrangement of the target local LDPC matrices ($H_L^{(1)}$ to $H_L^{(t)}$) in the block matrix ($H_{B1}$), such that, for any adjacent two of the target local LDPC matrices ($H_L^{(1)}$ to $H_L^{(t)}$) that are arranged from top to bottom along the main diagonal of the block matrix ($H_{B1}$), a foremost column part (e.g., the foremost p column (s)) of a lower one of the adjacent two of the target local LDPC matrices ($H_L^{(1)}$ to $H_L^{(t)}$) is aligned with a last column part (e.g., the last p column(s)) of a higher one of the adjacent two of the target local LDPC matrices ($H_L^{(1)}$ to $H_L^{(t)}$). In other words, the adjacent two target local LDPC matrices ($H_L^{(1)}$ to $H_L^{(t)}$) in the block matrix ($H_{B1}$) may be linearly shifted to occupy p columns in common, where p is a number defined by a user as desired and is greater than or equal to one. Taking a simple example for illustration purposes, if t=3, p=1, $$H_L^{(1)} = \begin{bmatrix} 1 & 2 \\ 3 & 4 \end{bmatrix}, H_L^{(2)} = \begin{bmatrix} 5 & 6 \\ 7 & 8 \end{bmatrix} \text{ and } H_L^{(3)} = \begin{bmatrix} 4 & 6 \\ 2 & 1 \end{bmatrix},$$

then $$H_{B1} = \begin{bmatrix} 1 & 2 & & & \\ 3 & 4 & & & \\ & 5 & 6 & & \\ & 7 & 8 & & \\ & & & 4 & 6 \\ & & & 2 & 1 \end{bmatrix}.$$

It is noted that the greater p may lead to a smaller codeword length for block codes of the encoded data, thereby reducing computational load at the cost of lower error correction ability.

In step 205, the encoder device 111 determines whether a number of columns of the block matrix ($H_{B1}$) equals a number of columns of the global LDPC matrix ($H_G$). The flow goes to step 206 when the determination is negative, and goes to step 207 when otherwise.

In step 206, the encoder device 111 determines whether the number of columns of the block matrix ($H_{B1}$) is smaller than the number of columns of the global LDPC matrix ($H_G$). The flow goes to step 208 when the determination is affirmative, and goes to step 209 when otherwise.

In step 207, the encoder device 111 makes the block matrix ($H_{B1}$) serve as the first primary matrix part, and makes the global LDPC matrix ($H_G$) serve as the second primary matrix part. The flow then goes to step 210.

In step 208, the encoder device 111 removes at least one column of the global LDPC matrix ($H_G$) from the global LDPC matrix ($H_G$) to obtain the second primary matrix part, such that a number of columns of the second primary matrix part equals the number of columns of the block matrix ($H_{B1}$) that serves as the first primary matrix part, and the flow goes to step 210.

In step 209, the encoder device 111 removes at least one column of the block matrix ($H_{B1}$) from the block matrix ($H_{B1}$) to obtain the first primary matrix part, such that a number of columns of the first primary matrix part equals the number of columns of the global LDPC matrix ($H_G$) that serves as the second primary matrix part, and the flow goes to step 210.

As a result, after step 207, 208 or 209, the first primary matrix part of the primary LDPC matrix ($H_P$) includes a plurality of local LDPC matrix portions respectively corresponding to the target local LDPC matrices ($H_L^{(1)}$ to $H_L^{(t)}$).

In step 210, the encoder device 111 generates the primary LDPC matrix ($H_P$) based on the first primary matrix part and the second primary matrix part, such that a number of columns of the primary LDPC matrix ($H_P$) equals the number of columns of the first primary matrix part, and the number of columns of the second primary matrix part.

Figure 4:
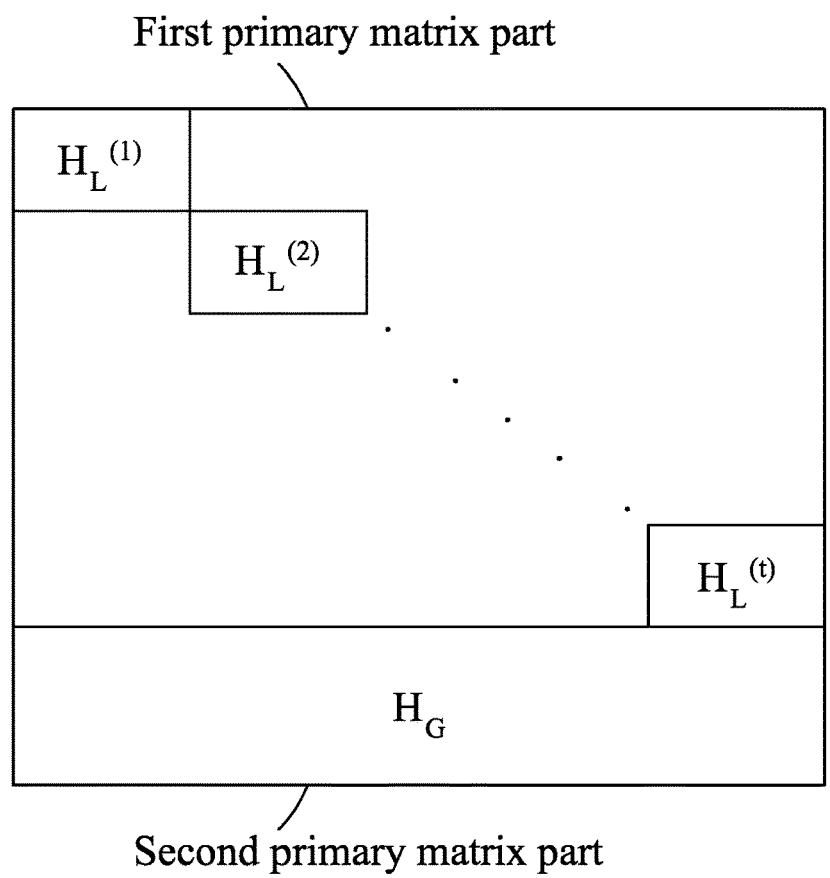
FIG. 4 is a schematic diagram illustrating an exemplary primary LDPC matrix according to the first embodiment.
Figure 5:
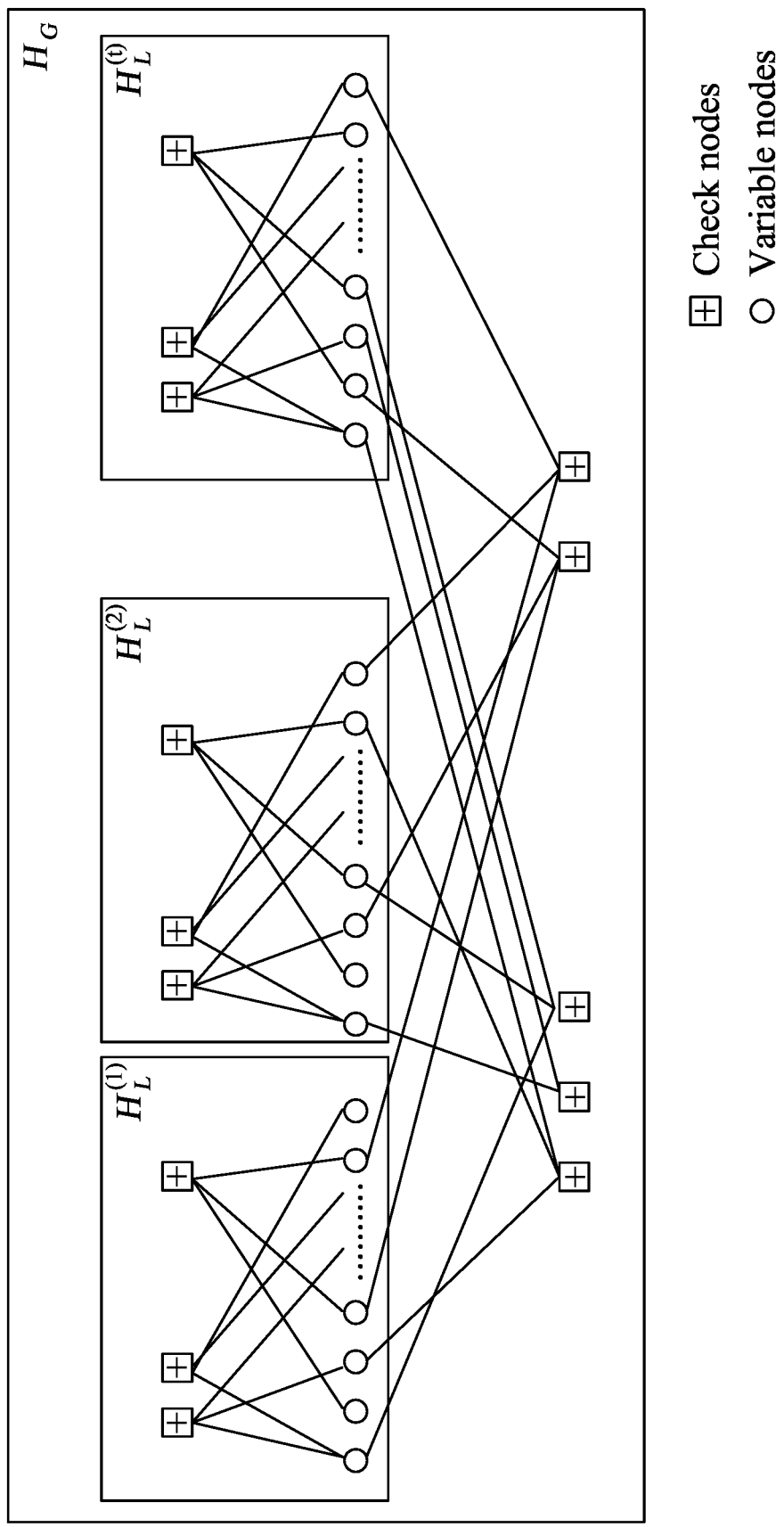
FIG. 5 is a Tanner graph corresponding to the exemplary primary LDPC matrix shown in FIG. 4.
Figure 6:
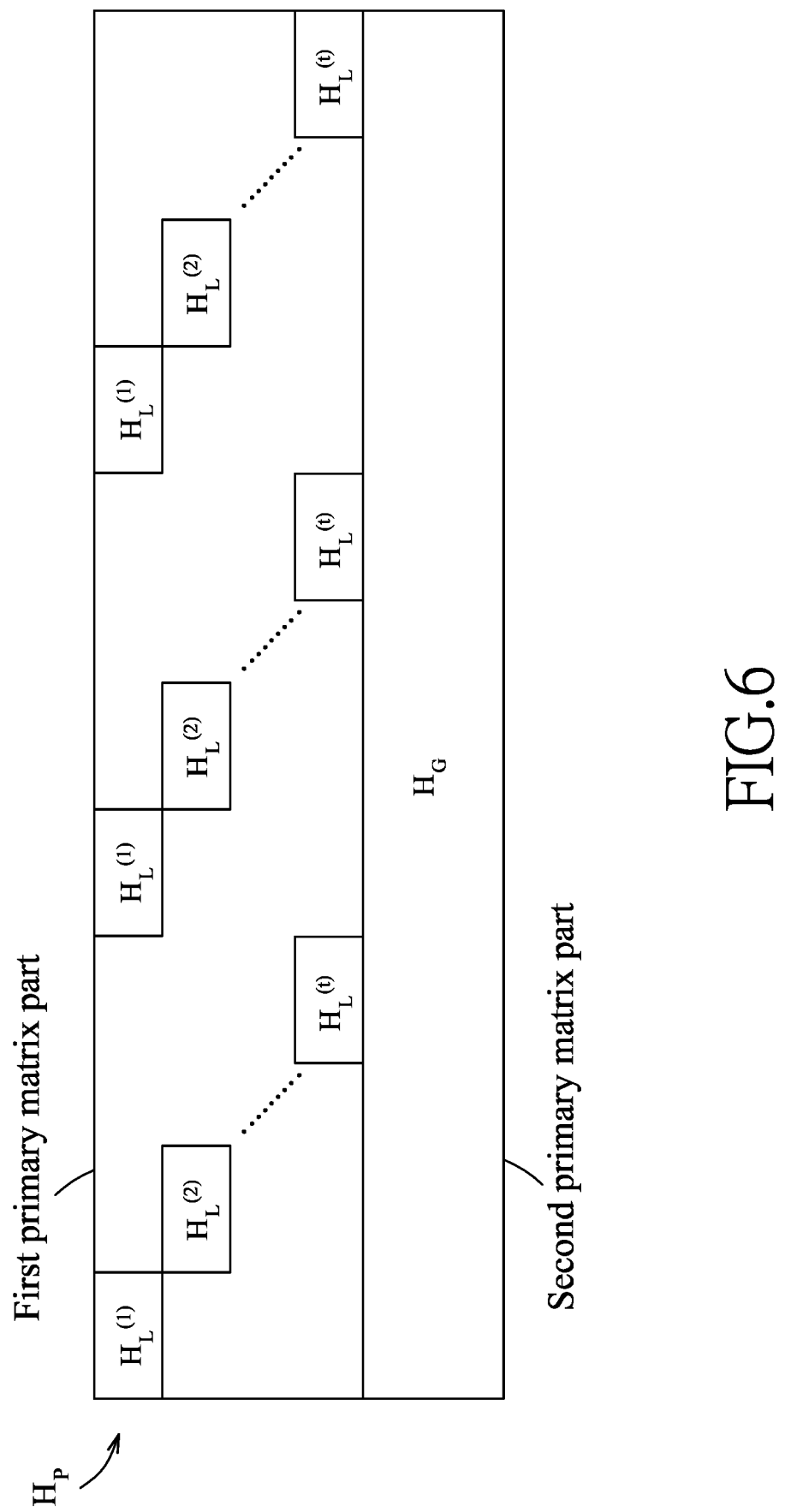
FIG. 6 is a schematic diagram illustrating another exemplary primary LDPC matrix according to the first embodiment.

In this embodiment, the primary LDPC matrix ($H_P$) is exemplarily constructed as shown in FIG. 4, where, in the primary LDPC matrix ($H_P$), the first primary matrix part is arranged above the second primary matrix part, and a row following a last row of the first primary matrix part is a first row of the second primary matrix part. FIG. 5 exemplarily shows a Tanner graph corresponding to the primary LDPC matrix ($H_P$) of this embodiment. In other embodiments, the primary LDPC matrix ($H_P$) may be constructed such that the first primary matrix part is arranged under the second primary matrix part, and a row following a last row of the second primary matrix part is a first row of the first primary matrix part. FIG. 6 shows another implementation of the primary LDPC matrix ($H_P$).

In step 211, the encoder device 111 encodes the transmission data based on the primary LDPC matrix ($H_P$) to generate the encoded data. The encoded data includes a plurality of block codes. Each block code has a number t of local codes respectively corresponding to the local LDPC matrix portions, and in turn the target local LDPC matrices ($H_L^{(1)}$ to $H_L^{(t)}$), and each local code relates to the global LDPC matrix ($H_G$).

Figure 7:
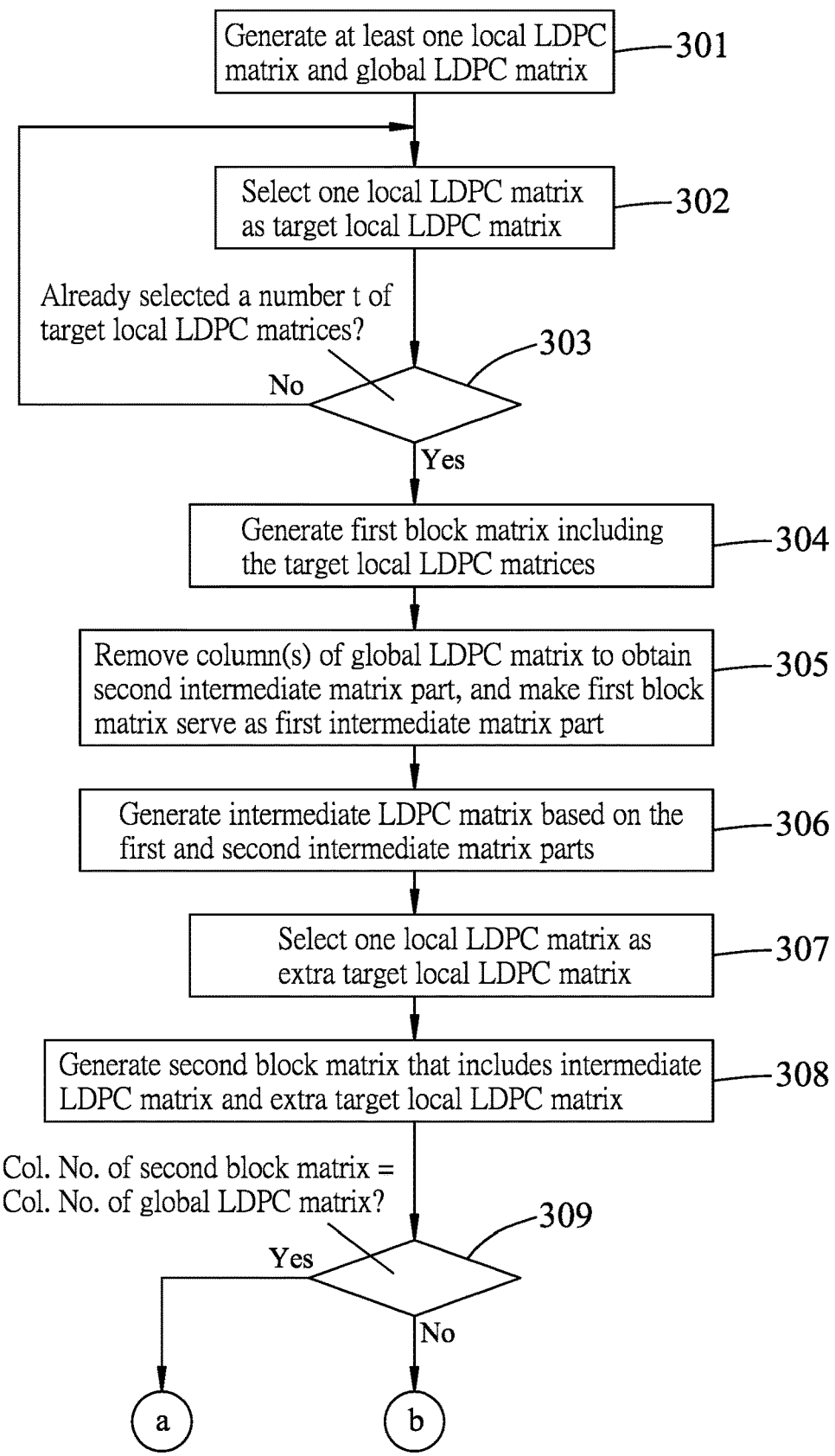
FIGS. 7 and 8 cooperatively show a flow chart illustrating steps of a second embodiment of a method for generating encoded data according to this disclosure.
Figure 8:
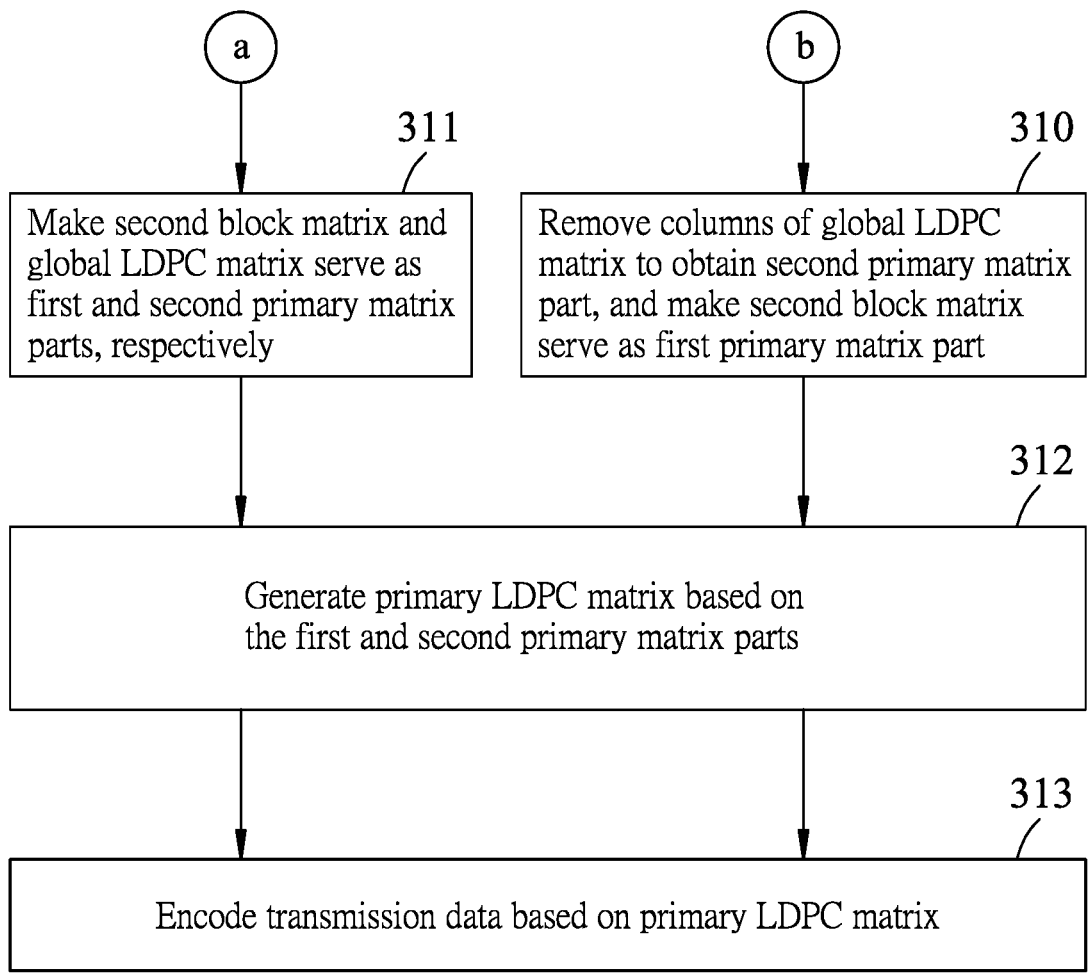

Referring to FIGS. 1, 7 and 8, a second embodiment of the method for generating encoded data that is encoded based on low-density parity-check (LDPC) codes includes steps 301-313, among which steps 301-303 are respectively the same as steps 201-203 that are shown in FIG. 2. In this embodiment, the first primary matrix part relates to an intermediate LDPC matrix ($H_S$), and the second primary matrix part relates to the global LDPC matrix ($H_G$). The intermediate LDPC matrix ($H_S$) includes a first intermediate matrix part relating to the first block matrix ($H_{B1}$), and a second intermediate matrix part relating to the global LDPC matrix ($H_G$).

In step 304, the encoder device 111 generates a first block matrix ($H_{B1}$) that includes the target local LDPC matrices ($H_L^{(1)}$ to $H_L^{(t)}$) selected in different instances of step 302, that relates to the first primary matrix part of the primary LDPC matrix ($H_P$). A number of columns of the first block matrix ($H_{B1}$) is smaller than a number of columns of the global LDPC matrix ($H_G$).

In step 305, the encoder device 111 removes at least one column of the global LDPC matrix ($H_G$) from the global LDPC matrix ($H_G$) to obtain the second intermediate matrix part, such that a number of columns of the second intermediate matrix part equals the number of columns of the first block matrix ($H_{B1}$) that serves as the first intermediate matrix part, and the flow goes to step 306.

In step 306, the encoder device 111 generates the intermediate LDPC matrix ($H_S$) based on the first intermediate matrix part and the second intermediate matrix part. A number of columns of the intermediate LDPC matrix ($H_S$) equals a number of columns of the first block matrix ($H_{B1}$).

In step 307, the encoder device 111 selects one local LDPC matrix ($H_{Li}$) as an extra target local LDPC matrix $H_L^{(t+1)}$.

In step 308, the encoder device 111 generates a second block matrix ($H_{B2}$) that includes the intermediate LDPC matrix ($H_S$) and the extra target local LDPC matrix $H_L^{(t+1)}$. A number of columns of the second block matrix ($H_{B2}$) is smaller than or equal to a number of columns of the global LDPC matrix ($H_G$).

In step 309, the encoder device 111 determines whether the number of columns of the second block matrix ($H_{B2}$) equals the number of columns of the global LDPC matrix ($H_G$). The flow goes to step 310 when the determination is negative, and goes to step 311 when otherwise.

In step 310, the encoder device 111 removes at least one column of the global LDPC matrix ($H_G$) from the global LDPC matrix ($H_G$) to obtain the second primary matrix part, such that a number of columns of the second primary matrix part equals the number of columns of the second block matrix ($H_{B2}$) that serves as the first primary matrix part, and the flow goes to step 312.

In step 311, the encoder device 111 makes the second block matrix ($H_{B2}$) serve as the first primary matrix part, and makes the global LDPC matrix ($H_G$) serve as the second primary matrix part, and the flow goes to step 312.

In step 312, the encoder device 111 generates the primary LDPC matrix ($H_P$) based on the first primary matrix part and the second primary matrix part, such that a number of columns of the primary LDPC matrix ($H_P$) equals the number of columns of the first primary matrix part, and the number of columns of the second primary matrix part.

In step 313, the encoder device 111 encodes the transmission data based on the primary LDPC matrix ($H_P$) to generate the encoded data. The encoded data includes a plurality of block codes. Each block code may have two local codes respectively corresponding to the intermediate LDPC matrix ($H_S$) and the extra target local LDPC matrix ($H_L^{(t+1)}$), and each local code relates to the global LDPC matrix ($H_G$).

Since steps 312 and 313 are respectively the same as steps 210 and 211 of the first embodiment (see FIG. 3), details thereof are not repeated for the sake of brevity.

Figure 9:
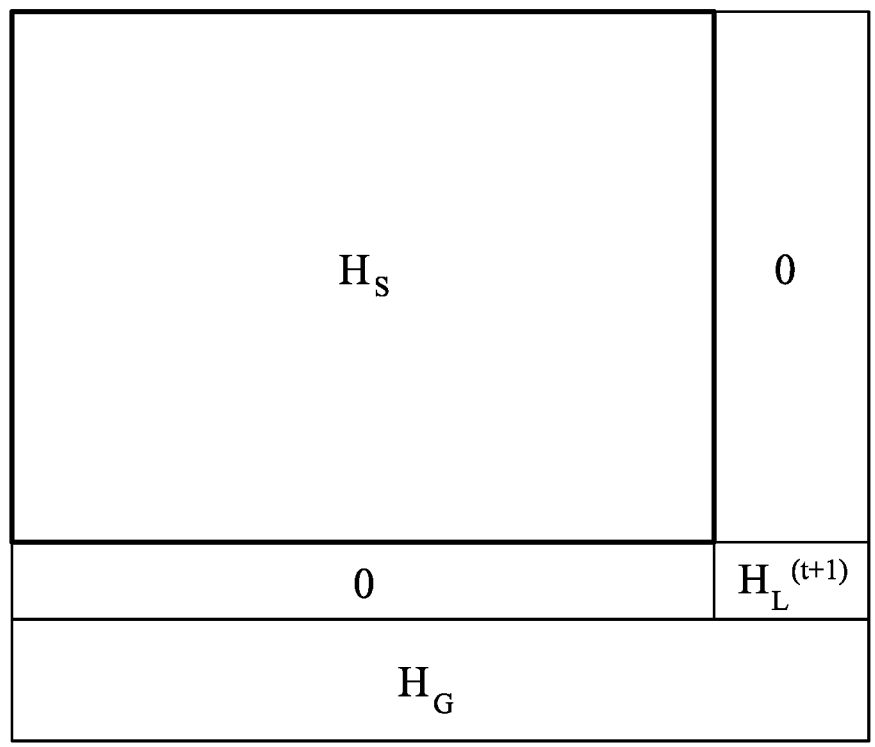
FIG. 9 is a schematic diagram illustrating an exemplary primary LDPC matrix according to the second embodiment.

FIG. 9 shows an exemplary primary LDPC matrix ($H_P$) constructed according to the second embodiment.

Figure 10:
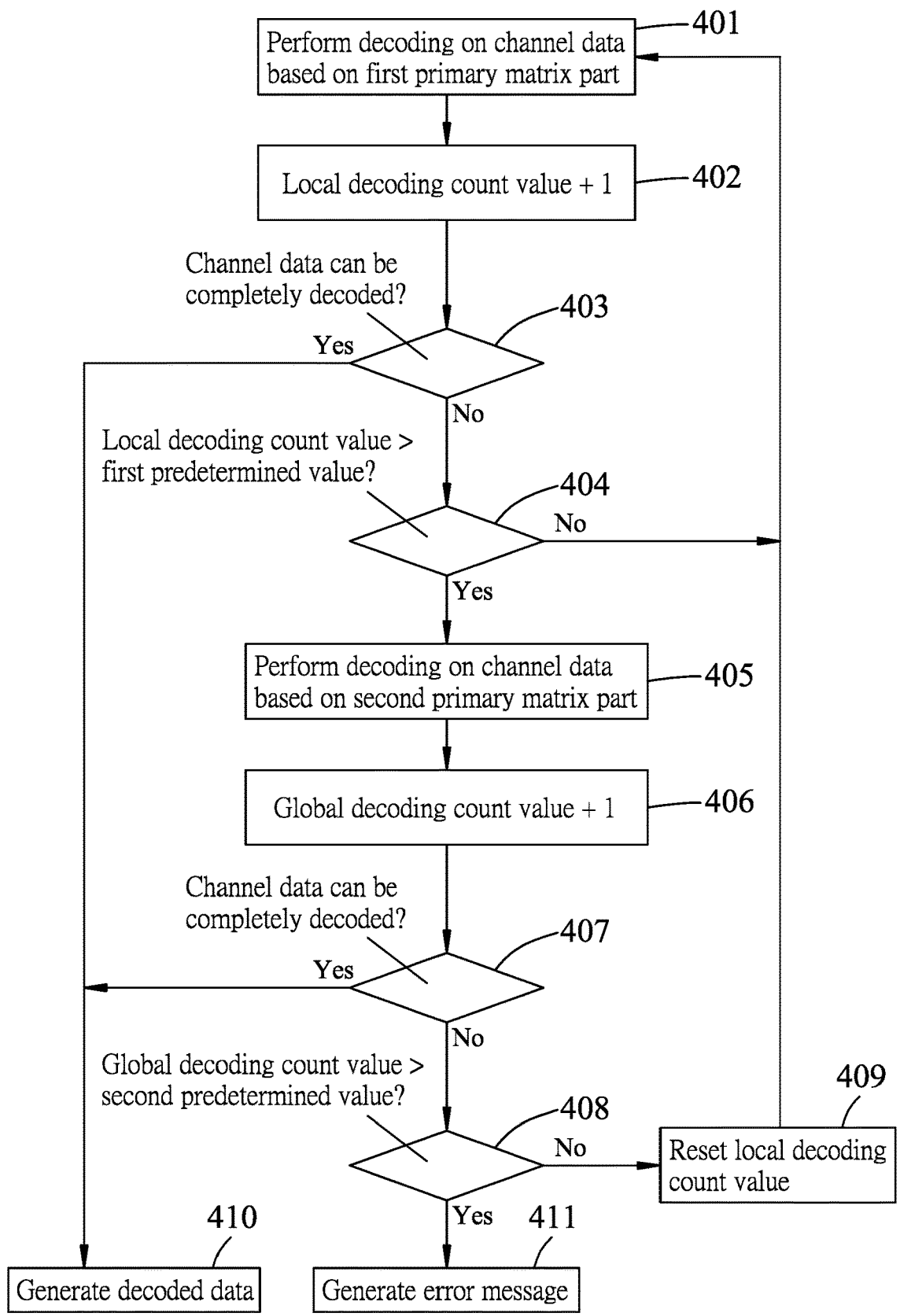
FIG. 10 is a flow chart illustrating steps of an embodiment of a method for decoding channel data according to this disclosure.

Referring to FIGS. 1 and 10, an embodiment of a method for decoding the channel data corresponding to the encoded data is shown to be implemented by the decoder device 121 of the receiver end 12. In this embodiment, the encoded data to which the channel data corresponds is generated according to the abovementioned first embodiment. The receiver end 12 stores the primary LDPC matrix ($H_P$) used by the encoder device 111 of the transmitter end 11 therein, and the decoder device 121 stores a local decoding count value and a global decoding count value, each of which may initially be zero.

Figure 11:
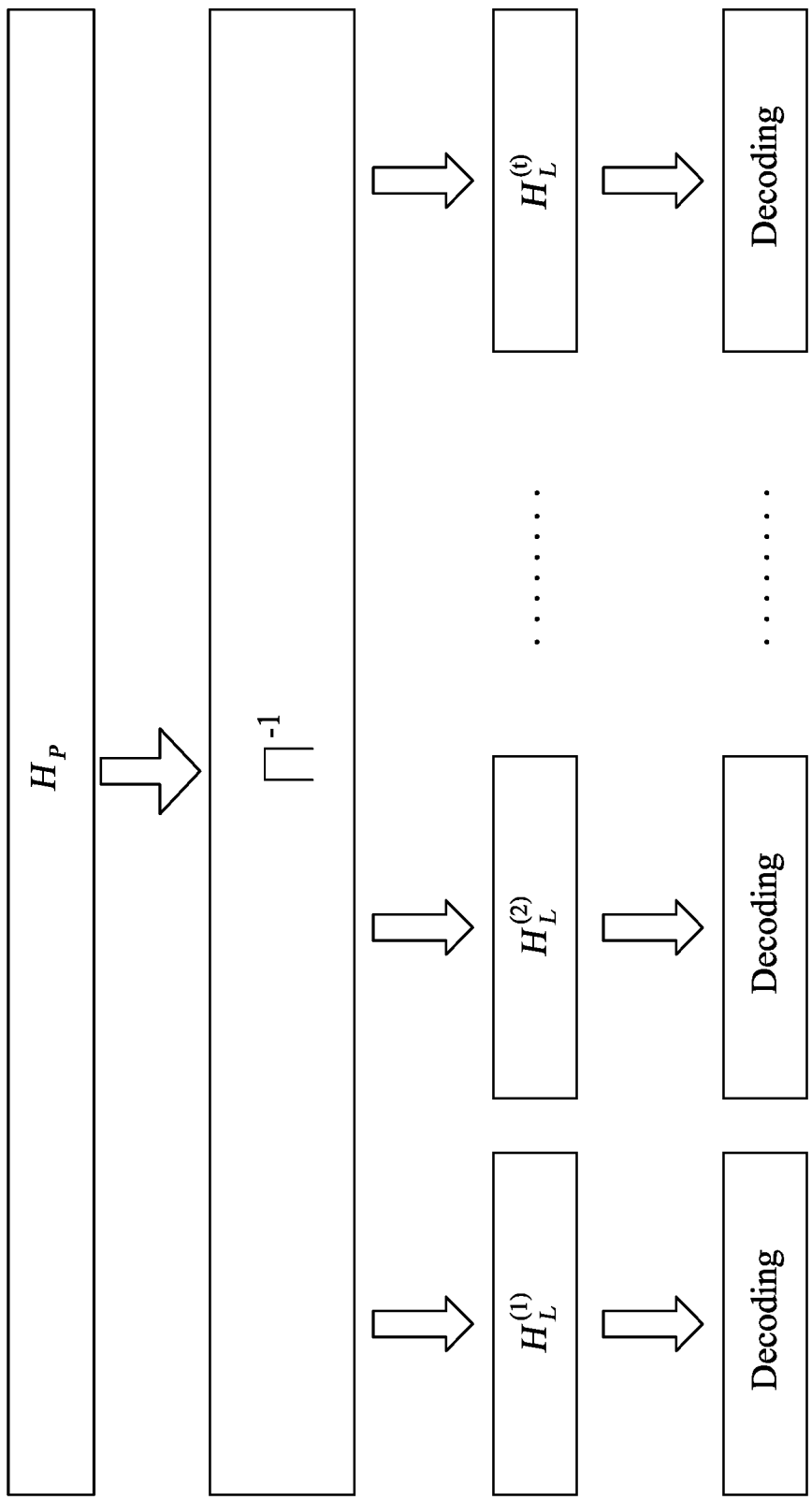
FIG. 11 is a schematic diagram illustrating step 401 shown in FIG. 10.

In step 401, the decoder device 121 performs decoding on the channel data based on the first primary matrix part of the primary LDPC matrix ($H_P$) to generate a local decoding result (e.g., a bit error rate of the data decoded through the local decoding, or a check result indicating whether there are uncorrected errors remaining in the locally decoded data). In this embodiment, the decoder device 121 may include a plurality of decoders to independently perform the decoding on the channel data in parallel using the local LDPC matrix portions of the first primary matrix part, respectively, as shown in FIG. 11, but this disclosure is not limited in this respect. It is noted that, in FIG. 11, $H_L^{(1)}$ to $H_L^{(t)}$ are used to respectively represent the local LDPC matrix portions that respectively correspond to the target local LDPC matrices $H_L^{(1)}$ to $H_L^{(t)}$.

In step 402, the decoder device 121 adds one to the local decoding count value.

In step 403, the decoder device 121 determines, based on the local decoding result, whether the channel data can be completely decoded based on the first primary matrix part. The flow goes to step 404 when the determination is negative, and goes to step 410 when otherwise.

In step 404, the decoder device 121 determines whether the local decoding count value is greater than a first predetermined value. The flow goes to step 405 when the determination is affirmative, and goes back to step 401 when otherwise.

In step 405, the decoder device 121 performs decoding on the channel data based on the second primary matrix part to generate a global decoding result (e.g., a bit error rate of the data decoded through the global decoding, or a check result indicating whether there are uncorrected errors remaining in the globally decoded data)).

In step 406, the decoder device 121 adds one to the global decoding count value.

In step 407, the decoder device 121 determines, based on the global decoding result, whether the channel data can be completely decoded based on the second primary matrix part. The flow goes to step 408 when the determination is negative, and goes to step 410 when otherwise.

In step 408, the decoder device 121 determines whether the global decoding count value is greater than a second predetermined value. The flow goes to step 409 when the determination is negative, and goes to step 411 when otherwise.

In step 409, the decoder device 121 resets the local decoding count value (to zero), and the flow goes back to step 401.

In step 410, the decoder device 121 completely decodes the channel data, thus generating the decoded data corresponding to the transmission data.

In step 411, the decoder device 121 generates an error message relating to failure of decoding.

When the decoding has failed, the receiver end 12 may transmit the error message to the transmitter end 11, so that the encoder device 111 of the transmitter end 11 may expand the primary LDPC matrix ($H_P$) to re-encode the transmission data. It is noted that steps 307 to 312 in the second embodiment (see FIGS. 7 and 8) may be used to expand the primary LDPC matrix by making the original primary LDPC matrix serve as the intermediate LDPC matrix, thereby obtaining an expanded primary LDPC matrix, which is subsequently provided to the receiver end 12 for decoding. In one embodiment, after step 409, the encoder device 111 may expand the primary LDPC matrix, and use the expanded primary LDPC matrix in the next (repeated) round of the process steps, but this disclosure is not limited in this respect.

The method of generating the encoded data and the decoded data according to this disclosure may be implemented in a variety of applications, examples of which are provided below.

1. Distributed data storage systems: For example, in a Hadoop distributed file system, a cluster management node (e.g., a NameNode) may split a file into multiple split files, and encode the split files using the primary LDPC matrix ($H_P$) to generate encoded split files, each corresponding to one of the target local LDPC matrices ($H_L^{(1)}$ to $H_L^{(t)}$), thereby providing additional protection for the file. Moreover, since the target local LDPC matrices ($H_L^{(1)}$ to $H_L^{(t)}$) are independent from each other, the encoded split files can be decoded independently during decoding. Subsequent to generating the encoded split files, the cluster management node stores the encoded split files in other nodes such as DataNodes. During the local decoding, the each DataNode decodes the respective encoded split file using a respective local LDPC matrix portion of the first primary matrix part, and transmits a respective decoding result and corresponding reliability information to the cluster management node. If the cluster management node determines that the error contained in the decoding results is at an unacceptable level, the cluster management node may correct the error using the second primary matrix part of the primary LDPC matrix ($H_P$).

2. Partial decoding for flash memories: For example, in a triple-level cell, a cell element may store three bits of information, and the three bits may have different bit error rates. In writing operation, the three bits may be encoded based on the primary LDPC matrix ($H_P$) in correspondence to three different local LDPC matrix portions of the first primary matrix part, respectively, so that the target local LDPC matrices that respectively correspond to the local LDPC matrix portions may be designed based on the bit error rates of the three bits. In reading operation, when the decoding can be completed by the local LDPC matrix portions of the first primary matrix part, the decoding by the second primary matrix part is not required. When the second primary matrix part is used in the decoding, the bit having the lower bit error rate may be completely decoded earlier, and the corresponding reliability information may be provided to assist in convergence of decoding of other bits.

3. Time-varying codeword length and code rate: The codeword length and the code rate of the block code are adjustable according to this disclosure by changing the number of the target local LDPC matrices ($H_L^{(1)}$ to $H_L^{(t)}$) or changing the size of each target local LDPC matrix ($H_L$). For instance, the bit error rate of the flash memory may rise with time of use, so the codeword length and the code rate can be adjusted accordingly to achieve a balance between efficiency and reliability.

4. Packet aggregation: In packet aggregation, data encoding may be performed using the primary LDPC matrix ($H_P$) in a way that each packet corresponds to one of the local LDPC matrix portions of the first primary matrix part. The receiver end 12 performs decoding on each packet using the corresponding local LDPC matrix portion. When the decoding cannot be completed for every packet, the receiver end 12 may subsequently perform the decoding using the second primary matrix part which corresponds to the global LDPC matrix ($H_G$) to correct error of the packets. Accordingly, the second primary matrix part provides additional error correction ability among the packets, which may reduce a number of times of re-transmission of packets due to packet errors, and promote the data transmission rate and the efficiency in use of a packet-based communication network.

5. Multi-input multi-output (MIMO) multiplexing system: Spatial multiplexing may be performed after the transmission data is encoded using the primary LDPC matrix ($H_P$), such that each spatial stream corresponds to one of the local LDPC matrix portions of the first primary matrix part, which is selected to obtain desired codeword length and code rate in correspondence to a condition of the transmission channel 13 that is known in advance. The decoders of the decoder device 121 of the receiver end 12 may independently perform decoding on the spatial streams in parallel at first. If the spatial streams cannot be completely decoded using local decoding, the receiver end 12 may subsequently perform global decoding using the second primary matrix part to correct errors.

6. Code rate matching and data puncture: After encoding using the primary LDPC matrix ($H_P$), each block code of the encoded data may have several bit positions that are selected to be punctured (not transmitted). Different block codes may have the same or different punctured bit positions, and may have same or different numbers of the punctured bit positions. After the decoding, the receiver end 12 may transmit the decoding result and provide, based on the decoding result, an advice of a puncture ratio to the transmitter end 11. The advised puncture ratio may be derived from decoding conditions of the decoders that perform local decoding. If the receiver end 12 cannot completely decode the channel data (i.e., errors in the channel data cannot be corrected at an acceptable level), the transmitter end 11 may subsequently transmit the punctured bits to the receiver end 12 according to the feedback of the receiver end 12.

7. Progressive redundant data protection: When the receiver end 12 reports that the channel data cannot be completely decoded, the transmitter end 11 may expand the primary LDPC matrix ($H_P$) (increasing the redundant data), thereby providing better error correcting ability (better data protection). The primary LDPC matrix ($H_P$) can be repeatedly expanded until the channel data is completely decoded or a number of decoding operations has reached a user-defined upper limit.

In summary, by virtue of the primary LDPC matrix ($H_P$) according to this disclosure, the first primary matrix part causes the block codes of the encoded data to have shorter codeword lengths, leading to higher computational efficiency, while the second primary matrix part ensures that the encoded data has superior error correction ability comparable to the case with longer codeword lengths.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for generating encoded data that is encoded based on low-density parity-check (LDPC) codes by an encoder device for data transmission, said method comprising:

generating at least one local LDPC matrix and a global LDPC matrix, the global LDPC matrix relating to each of the at least one local LDPC matrix;

repeatedly selecting one of the at least one local LDPC matrix as a target local LDPC matrix until a number t of target local LDPC matrices are selected, where t is a user-defined number that is greater than one;
generating a first block matrix that includes the target local LDPC matrices;
generating a primary LDPC matrix that includes a first primary matrix part relating to the first block matrix, and a second primary matrix part relating to the global LDPC matrix; and
encoding data based on the primary LDPC matrix to generate the encoded data.

2. The method of claim 1, wherein, in the primary LDPC matrix, a row next to a last row of the first primary matrix part is a first row of the second primary matrix part.

3. The method of claim 1, wherein, in the first block matrix, the target local LDPC matrices are arranged along a main diagonal of the first block matrix.

4. The method of claim 1, wherein the generating the primary LDPC matrix includes:
determining whether a number of columns of the first block matrix equals a number of columns of the global LDPC matrix;
upon determining that the number of columns of the first block matrix equals the number of columns of the global LDPC matrix, generating, based on the first block matrix that serves as the first primary matrix part and the global LDPC matrix that serves as the second primary matrix part, the primary LDPC matrix of which a number of columns equals the number of columns of the first block matrix;
upon determining that the number of columns of the first block matrix does not equal the number of columns of the global LDPC matrix, determining whether the number of columns of the first block matrix is smaller than the number of columns of the global LDPC matrix;
upon determining that the number of columns of the first block matrix is smaller than the number of columns of the global LDPC matrix, removing at least one column of the global LDPC matrix from the global LDPC matrix to obtain the second primary matrix part, such that a number of columns of the second primary matrix part equals the number of columns of the first block matrix that serves as the first primary matrix part, and generating, based on the first primary matrix part and the second primary matrix part, the primary LDPC matrix of which the number of columns equals the number of columns of the first block matrix; and
upon determining that the number of columns of the first block matrix is not smaller than the number of columns of the global LDPC matrix, removing at least one column of the first block matrix from the first block matrix to obtain the first primary matrix part, such that a number of columns of the first primary matrix part equals the number of columns of the global LDPC matrix that serves as the second primary matrix part, and generating, based on the first primary matrix part and the second primary matrix part, the primary LDPC matrix of which the number of columns equals the number of columns of the first primary matrix part.

5. The method of claim 1, wherein the generating the primary LDPC matrix includes:
generating an intermediate LDPC matrix that includes a first intermediate matrix part relating to the first block matrix, and a second intermediate matrix part relating to the global LDPC matrix, a number of columns of the intermediate LDPC matrix equals a number of columns of the first block matrix;
selecting one of the at least one local LDPC matrix to serve as an extra target local LDPC matrix;
generating a second block matrix that includes the intermediate LDPC matrix and the extra target local LDPC matrix; and
generating the primary LDPC matrix of which the first primary matrix part relates to the second block matrix, and the second primary matrix part relates to the global LDPC matrix, a number of columns of the primary LDPC matrix equaling a number of columns of the second block matrix.

6. The method of claim 1, wherein the first block matrix is generated by:
arranging the target local LDPC matrices from top to bottom in an order of being selected in the repeatedly selecting one of the at least one local LDPC matrix in a way that, for any adjacent two of the target local LDPC matrices, a foremost column part of a lower one of the adjacent two of the target local LDPC matrices is aligned with a last column part of a higher one of the adjacent two of the target local LDPC matrices.

7. The method of claim 1, wherein the at least one local LDPC matrix includes a number n of local LDPC matrices each being constructed using elements of a finite field of order q, where n is a positive integer greater than or equal to one, and q is a prime power;
wherein an $i^{th}$ one of the local LDPC matrices is represented as:

$$H_{Li}(d_{1i}, \gamma_i) = \begin{bmatrix} \gamma_i^0 & \gamma_i^1 & \cdots & \gamma_i^{(\lambda-1)} \\ \gamma_i^0 & \gamma_i^2 & \cdots & \gamma_i^{2(\lambda-1)} \\ \vdots & \vdots & \ddots & \vdots \\ \gamma_i^0 & \gamma_i^{d_{1i}} & \cdots & \gamma_i^{d_{1i}(\lambda-1)} \end{bmatrix},$$

where i is an integer between 1 and n, $\gamma_i = \beta^{p_i}$, $\beta = \alpha^{q-1/p_1 p_2 \cdots p_n^\lambda}$, $\alpha$ belongs to the finite field of order q, $p_i$ and $\lambda$ are prime divisors of q−1, $\lambda > \max(p_i)$, and $$d_{1i} < \left\lfloor \frac{\lambda}{p_i} \right\rfloor;$$

and
wherein the global LDPC matrix is represented as:

$$H_G(d_2, \beta) = \begin{bmatrix} \beta^0 & \beta^1 & \cdots & \beta^{(p_1 p_2 \cdots p_n \lambda - 1)} \\ \beta^0 & \beta^2 & \cdots & \beta^{2(p_1 p_2 \cdots p_n \lambda - 1)} \\ \vdots & \vdots & \ddots & \vdots \\ \beta^0 & \beta^{d_2} & \cdots & \beta^{d_2(p_1 p_2 \cdots p_n \lambda - 1)} \end{bmatrix},$$

where $d_2 < \min(p_i)$.

8. A method for decoding channel data which is received from a transmission channel and which is encoded using a primary low-density parity-check (LDPC) matrix, the primary LDPC matrix including a first primary matrix part relating to a plurality of local LDPC matrices, and a second primary matrix part relating to a global LDPC matrix, the global LDPC matrix relating to each of the local LDPC matrices, said method being implemented by a decoder device and comprising:

a step (A): performing decoding on the channel data based on the first primary matrix part to generate a local decoding result;

a step (B): determining, based on the local decoding result, whether the channel data can be completely decoded based on the first primary matrix part; and a step (C): upon determining that the channel data cannot be completely decoded based on the first primary matrix part in the step (B), performing decoding on the channel data based on the second primary matrix part.

9. The method of claim 8, the first primary matrix part including a plurality of local LDPC matrix portions respectively corresponding to the local LDPC matrices, wherein the channel data includes a plurality of local codes respectively corresponding to the local LDPC matrix portions; and wherein the step (A) includes performing decoding on the local codes in parallel using the local LDPC matrix portions, respectively.

10. The method of claim 8, the decoder device storing a local decoding count value, said method further comprising a step (D) after the step (A), wherein the step (D) includes adding one to the local decoding count value;

said method further comprising a step (E) after determining that the channel data cannot be completely decoded based on the first primary matrix part in the step (B), wherein the step (E) includes determining whether the local decoding count value is greater than a first predetermined value, followed by:

upon determining that the local decoding count value is greater than the first predetermined value, performing the step (C); and upon determining that the local decoding count value is not greater than the first predetermined value, repeating the step (A).

11. The method of claim 10, the decoder device storing a global decoding count value, said method further comprising a step (F) and a step (G) after the step (C), wherein the step (F) includes adding one to the global decoding count value; and wherein the step (G) includes determining, based on a global decoding result corresponding to the step (C), whether the channel data can be completely decoded based on the second primary matrix part;

said method further comprising a step (H) upon determining, based on the global decoding result, that the channel data cannot be completely decoded based on the second primary matrix part, wherein the step (H) includes determining whether the global decoding count value is greater than a second predetermined value, followed by:

upon determining that the global decoding count value is not greater than the second predetermined value in the step (H), resetting the local decoding count value, and repeating the steps (A) through (G).

* * * * *